(12) United States Patent
Froidevaux et al.

(10) Patent No.: US 8,446,221 B2
(45) Date of Patent: May 21, 2013

(54) ELECTRONIC CIRCUIT WITH A LINEAR AMPLIFIER ASSISTED BY A SWITCH-MODE AMPLIFIER

(75) Inventors: Claude Froidevaux, La Chaux-de-Fonds (CH); Jean-Marc Vaucher, Couvet (CH)

(73) Assignee: ETEL S.A., Motiers (SE)

( * ) Notice: Subject to any disclaimer, the term of this patent is extended or adjusted under 35 U.S.C. 154(b) by 0 days.

(21) Appl. No.: 13/109,413

(22) Filed: May 17, 2011

(65) Prior Publication Data

US 2011/0279183 A1 Nov. 17, 2011

(30) Foreign Application Priority Data

May 17, 2010 (CH) ........................................ 761/10

(51) Int. Cl.
*H03F 3/217* (2006.01)
(52) U.S. Cl.
USPC ...................................... 330/251; 330/207 A
(58) Field of Classification Search
USPC ................. 330/10, 207 A, 251; 381/120, 121
See application file for complete search history.

(56) References Cited

U.S. PATENT DOCUMENTS

| | | | |
|---|---|---|---|
| 6,396,933 B1 * | 5/2002 | Jung et al. ................. | 330/207 A |
| 6,476,674 B2 * | 11/2002 | Smedegaard-Pedersen et al. .............................. | 330/251 |
| 7,385,363 B2 | 6/2008 | Schemm | |
| 2011/0304397 A1 * | 12/2011 | Stanley ......................... | 330/277 |

OTHER PUBLICATIONS

H. Ertl, et al., "Basic Considerations and Topologies of Switched-Mode Assisted Linear Power Amplifiers," IEEE Transactions on Industrial Electronics 44(1): 116-123 (1997).
G. Walker, "A Class B Switch-Mode Assisted Linear Amplifier," IEEE Transactions on Power Electronics 18(6): 1278-1285 (2003).
R. Pastorino, et al., "X-by-Wire-Vehicle Prototype : A Steer-by-Wire-System with Geared PM Coreless Motors," 7th EUROMECH Solid Mechanics Conference, Lisbon, Portugal, p. 1-18 (2009).

* cited by examiner

*Primary Examiner* — Khanh V Nguyen
(74) *Attorney, Agent, or Firm* — Kenyon & Kenyon LLP

(57) ABSTRACT

An electronic circuit includes a linear amplifier unit having a first current feedback loop, assisted by a switched-mode amplification unit having a second current feedback loop. The inputs of the two units are connected so that they receive, at the same time, a current setpoint in an operating mode in order to generate a fixed current across a load connected to the output of the units. The first feedback loop includes a first sensor to measure the current in the load, a first subtractor element to subtract the first measured current from the current setpoint, a first controller connected to the output of the first subtractor element and controlling a linear amplifier, which supplies the first output current to the load. The second feedback loop includes a second current sensor to measure a second current supplied to the load, between a connecting node of two switches connected in series to a supply voltage source and an inductor whose output is connected to the load. The second loop further includes a second subtractor element to subtract the second measured current from the current setpoint, a second controller connected to the output of the second subtractor element and controlling a pulse-width modulator that controls the activation of the switches to alternately connect the inductor either to the high potential or to the low potential of the supply voltage source.

11 Claims, 7 Drawing Sheets

ELECTRONIC CIRCUIT WITH A LINEAR AMPLIFIER ASSISTED BY A SWITCH-MODE AMPLIFIER

CROSS-REFERENCE TO RELATED APPLICATIONS

The present application claims priority to Application No. 00761/10, filed in the Swiss Confederation on May 17, 2010, which is expressly incorporated herein in its entirety by reference thereto.

FIELD OF THE INVENTION

The present invention relates to an electronic circuit that includes a linear amplifier unit assisted by a switched-mode amplification unit.

BACKGROUND INFORMATION

A precise linear power amplifier can be used in various electronic applications, such as, for example, controlling an electric motor. As there is generally no ripple at the output of such a linear amplifier, it also possesses a very good signal-to-noise ratio (SNR). Current ripple is considered to be a drawback in an electric circuit, especially if it is used to control an electric motor for very precise positioning, since the vibrations generated by these ripples lead to a loss of positioning precision. To do so, a control voltage, which may be direct current, is applied to the input of the linear amplifier in order to supply a fixed current through a load at the output of the linear amplifier. This current is controlled by feedback, using the current measured at the load. The amplifier's output load may consist of the electric motor to be operated. Thus, the force generated in the motor is dependent on the current through the load, which may be partly resistive and inductive. Additionally, the load may have a voltage induced by the motor itself, which is proportional to the speed of movement.

A conventional linear power amplifier, which is connected to a DC power source, generally dissipates a considerable amount of thermal power. This results from the fact that the output stage must support the entire voltage drop between the voltage at one of the terminals of the supply voltage source and the voltage at the load through which the strong current passes. Significantly, one of the power transistors of the output stage is crossed by this strong current. This voltage difference, multiplied by the current through the load, provides the total power dissipation of the linear amplifier.

For example, for a DC supply voltage on the order of 48 V and a load voltage of around 20 V, with a current of 20 A, the power dissipated by one of the power transistors of the output stage can be on the order of 560 W. As a result, the output stage of such a linear power amplifier gets extremely hot. Therefore, it is necessary that an electronic circuit that includes such a linear power amplifier be designed to dissipate the least amount of thermal energy, since it may be employed in a device used in places where the temperature must be carefully controlled. In the case where a linear power amplifier equips a device placed, for example, in a clean room for integrated circuit manufacturing, it is necessary to reduce any thermal dissipation so that the clean room does not have to be supplied with a powerful air-conditioning system.

To resolve the problem of significant thermal dissipation in an electronic circuit, the conventional linear power amplifier may beneficially be combined in parallel with a switched-mode amplifier or amplification unit. In this case, the major part of the current across the load passes through the switched-mode amplifier instead of the output stage of the linear amplifier. In principal, once stabilized, the mean output current of the linear amplifier is close to 0 A. Nevertheless, some residual heat dissipation is found in the linear power amplifier, since the instantaneous value of the current is not zero. By using an electronic circuit with a linear amplifier assisted by a switched-mode amplifier, thermal dissipation is greatly reduced.

In this context, according to the article written by Hans Ertl, Johann W. Kolar, and Franz C. Zach, "Basic Consideration and Topologies of Switched-Mode Assisted Linear Power Amplifiers," published in IEEE Transactions on Industrial Electronics, Col. 44, No. 1, February 1997, an electronic circuit with a linear amplifier assisted by a switched-mode amplification unit is shown in FIG. 1a.

The electronic circuit 1 of FIG. 1a, therefore, principally includes a linear power amplifier 2 and a switched-mode amplification unit 3. Linear power amplifier 2 includes an operational amplifier 4 whose non-inverting input terminal receives a reference voltage IN for determining the voltage applied to the load Z at the output. A resistive divider, which includes two resistors R1 and R2, is connected to load Z at the output of linear amplifier 2 and to a reference voltage, which is preferably 0 V, such as a ground terminal. The connecting node of the two resistors R1 and R2 is connected to the inverting input terminal of operational amplifier 4 so that the voltage applied to load Z is dependent on the reference voltage IN. Resistors R1 and R2 can have the same resistance, which is, notably, much greater than the resistance of load Z.

Linear power amplifier 2 further includes two MOSFET type power transistors 7 and 8 connected in series between two terminals V+ and V− of a DC voltage source, which is not shown. The high potential, V+, of the supply voltage source can be, for example, on the order of 24 V, while the low potential, V−, of said supply voltage source can be, for example, on the order of −24 V. The drain of first n-type MOSFET transistor 7 is connected to the high potential terminal V+ of the supply voltage source, and the source is connected to the source of the second p-type MOSFET transistor 8 and to load Z. The drain of second p-type MOSFET transistor 8 is connected to the low potential terminal V− of the supply voltage source. The gates of first and second power transistors 7 and 8 are connected, respectively, by a first voltage source 5 and a second voltage source 6 to the output of operational amplifier 4. Each voltage source is used primarily to polarize to a suitable level the gate of the corresponding power transistor, whose barrier voltage can be greater than 5 V. In a conventional manner, each voltage source 5 and 6 can be used to more rapidly initiate conduction of corresponding power transistors 7 and 8 based on a voltage fluctuation at the output of operational amplifier 4.

Each MOSFET power transistor 7 and 8 in the output stage is brought to the conductive state based on current I1 supplied at the output of linear amplifier 2 to load Z. In the case where the value of current I1 is positive, first power transistor 7 is brought to the conductive state, whereas in the case where this current I1 has a negative value, it is the second power transistor 8 that is brought to the conductive state.

The conventional system described above also includes the use of a switched-mode amplification unit 3, which supplies a current I2 to load Z with a certain delay with respect to the activation of linear amplifier 2, as explained below. Addition of the two currents, I1 and I2, corresponds to the current I across said load Z.

Switched-mode amplification unit 3 of electronic circuit 1 of FIG. 1a includes a hysteresis controller 11, which receives a current value I1 measured by a current sensor 10 at the output of linear power amplifier 2. This hysteresis controller 11 provides a control signal to a buffer 12, which is connected to the gate of a first n-type MOSFET power transistor 13 and to an inverter 14, which is connected to the gate of a second n-type MOSFET power transistor 15. The drain of first n-type MOSFET power transistor 13 is connected to the high-potential terminal V+ of the supply voltage source, while the source of the second n-type MOSFET power transistor 15 is connected to the low-potential terminal V− of the supply voltage source. The source of first transistor 13 and the drain of second transistor 15 are connected to an inductor L, which is itself connected to load Z in order to supply current I2.

The voltage level of the control signal at the output of the hysteresis controller is used to bring into the conductive state, alternately and cyclically, either first power transistor 13 or second power transistor 15. Once current I1, measured by sensor 10, reaches a first hysteresis controller threshold, conduction of power transistors 13 and 15 is switched. Conduction switching of the power transistors inversely modifies the increase or decrease of current I2 supplied by the switched-mode amplification unit through inductor L. Depending on the increase or decrease of current I2 following the switching of power transistors 13 and 15, current I1 decreases or increases up to a second threshold of hysteresis controller 11. The addition of currents I1 and I2, in principle, does not modify the defined current I across load Z, since the voltage applied to the load's terminals is controlled by linear amplifier 2. Once current I1, measured by sensor 10, reaches the second threshold of hysteresis controller 11, the conduction of power transistors 13 and 15 is again switched. Power transistors 13 and 15 are again switched over time and cyclically based on switching period T. This creates a ripple in currents I1 and I2. On the other hand, the mean of current I1 is near 0 A once stabilized.

An electronic circuit with a switched-mode assisted linear amplifier unit whose structure is appreciably identical to that of the electronic circuit of FIG. 1a is described in an article written by Geoffrey R. Walker, entitled "A Class-B Switch-Mode Assisted Linear Amplifier," published in IEEE Transactions on Power Electronics, Col. 18, No. 6, November 2003. The main difference of this electronic circuit is that current I1 is measured by a first sensor at the drain of the first power transistor of the output stage of the linear amplifier and by a second sensor at the drain of the second power transistor. A first hysteresis controller of the switched-mode unit receives the value of current I1 from the first sensor, whereas a second hysteresis controller receives the value of current I1 from the second sensor. The switching principle of the power transistors of the switched-mode unit, however, is identical to what has been described with reference to FIG. 1a. Consequently, this electronic circuit has the same drawbacks as the electronic circuit of FIG. 1A.

To control the motor, the current circulating in the load needs to be controlled. To do this, a proportional-integral (PI) type controller is typically used, which is conventional in current practice. For example, reference is made to the article by R. Pastorino, M. A. Naya, J. A. Pérez, and J. Cuadrado entitled "X-by-Wire Vehicle Prototype: A Steer-by-Wire System with Geared PM Coreless Motors," published for the 7th Euromech Solid Mechanics conference held in Lisbon, Portugal, in September 2009. FIG. 3 of this article shows an example of current feedback by a linear amplifier and PI controller, whose operation is detailed in section 3.1.1.

FIG. 1b illustrates an improved configuration of electronic circuit 1 presented in FIG. 1a, in which the current is load compensated. Linear amplifier unit 20 includes a first current feedback loop. Notably, linear amplifier unit 20 includes a first subtractor element 23 of first current feedback loop. In this subtractor element 23, the current $I_{m1}$, which is measured across load Z by first sensor 25 in series with the load, is subtracted from the reference current $I_{ref}$ which is the current setpoint. The result of the subtraction is supplied to a first controller 24, which is preferably a conventional PI controller. This controller 24 supplies a control voltage to linear amplifier 2, which outputs a first current I1 that will cross load Z. The value of this current I1 is modified by linear amplifier unit 20 based on the voltage level detected at the load and, primarily, on measurement of the current I across the load. On the other hand, switched-mode amplification unit 3 includes the same elements as those described with reference to FIG. 1a, with current I1 measured by second sensor 10 being supplied to the input of the unit 3.

FIG. 1c shows another configuration of electronic circuit 1 shown in FIG. 1b. The main difference of electronic circuit 1 of this FIG. 1c is that the hysteresis controller is replaced by a second PI controller 31. In effect, the hysteresis controller includes certain drawbacks that will be detailed below, and it is desirable that it be replaced by a PI controller placed in series with a pulse-width modulator (PWM) 33 that controls the gate of power transistors 13 and 15. The operation of such a modulator 33 is known and is, for example, represented in FIG. 3 of U.S. Pat. No. 7,385,363. Therefore, no detailed information is provided regarding its internal operation. The modulator of U.S. Pat. No. 7,385,363 is used to switch power transistors 13 and 15 at constant frequency, which is not the case for the hysteresis controller of FIGS. 1a and 1b.

FIG. 2a graphically represents the variation in currents I1 and I2 over time based on a current setpoint $I_{ref}$ supplied initially to linear amplifier unit 20 of electronic circuit 1 of FIG. 1b. This electronic circuit includes hysteresis controller 11 in switched-mode amplification unit 3. Based on the setpoint, a current, $I_{ref}$, will cross the load as it leaves the linear amplifier unit and the switched-mode amplification unit. In this example, current $I_{ref}$ is defined sinusoidally at a frequency of 1 kHz and an amplitude of 1 A.

In the graph at the top of FIG. 2a, it is seen that the current in load I very closely follows setpoint $I_{ref}$. The observed phase difference, as well as the slight decrease in amplitude, are associated with the bandwidth of the current feedback from the linear amplifier unit. However, this total current is the sum of current I1 supplied by the linear amplifier unit and current I2 from the switched-mode amplification unit. The shape of these currents is shown in the graph at the bottom of FIG. 2a.

Once current I1 falls below 0 A to reach a first threshold of the hysteresis controller, the conduction of the power transistors is switched in the switched-mode unit. After switching, current I2 will decrease, whereas current I1 will increase to a second threshold of the hysteresis controller, whereby the power transistors of the switched-mode unit are switched once again. The difference between the first threshold and the second threshold of the controller represents a current difference ΔI, which can be adjusted. Switching of the power transistors of the switched-mode unit is repeated cyclically based on a switching period T.

Because current I1 at the output of the linear amplifier is not zero, some residual dissipation remains in the linear amplifier, which is a drawback. The smaller the current difference, ΔI, of the hysteresis controller, the greater the switching frequency of the power transistors in the switched-mode unit, which has a tendency to increase the switching losses of the electronic circuit. However, by increasing the current difference, ΔI, of the hysteresis controller, switching occurs less frequently while the switching period T increases, but more heat is dissipated by the linear amplifier. Additionally, depending on the value of the current setpoint supplied at the input of the linear amplifier unit, setpoint variations, and voltage variations induced in the motor, the switching period T will vary, which is a drawback. This frequency variation is clearly visible on the time-based curve and can, in particular, lead to problems of electromagnetic compatibility in the circuit.

To produce a satisfactory electronic circuit, a compromise must be sought between hysteresis and heat dissipation, as well as a dynamic compromise relative to the bandwidth of the switched-mode amplification unit and heat dissipation. With an electronic circuit as shown in FIG. 1a or 1b, normally, the signal-to-noise ratio can never be greater than 80 dB, which is a disadvantage. In this example, the root-mean-square (RMS) value of residual current I1 is 70.3 mA. This current can be used to estimate the thermal dissipation in the linear amplifier.

FIG. 2b graphically represents the current variation obtained with the electronic circuit of FIG. 1c, in which the hysteresis controller is replaced by PI controller 31 placed in series with PWM modulator 33. In the graph at the top of FIG. 2b, it is seen that the shape of the current in the load, I, is identical to that of FIG. 2a. In effect, the total current I depends only on the feedback occurring in linear amplifier unit 20.

In the graph at the bottom of FIG. 2b, it is seen that the switching period T is constant due to the use of PWM modulator 33, which is advantageous. On the other hand, residual current I1 has increased in comparison to that of FIG. 2a. In effect, its RMS value is now 138.6 mA. This is due to the phase delay between $I_{ref}$ and I1 resulting from the imperfection of the feedback occurring in linear amplifier unit 20. A second phase delay is introduced by PI controller 31. The residual current, therefore, includes a sinusoidal component that is clearly visible in FIG. 2b, in addition to the ripples associated with switching of the switched-mode unit.

SUMMARY

Example embodiments of the present invention provide an electronic circuit with a linear amplifier assisted by a switched-mode amplification unit that possesses high efficiency with good signal-to-noise ratio and low heat dissipation from the linear amplifier, while overcoming the aforementioned drawbacks found in current practice.

During operation of the electronic circuit according to example embodiments of the present invention, a current setpoint is supplied at the same time to the linear amplifier unit and to the switched-mode amplification unit. This allows the switched-mode amplification unit to rapidly supply a current to the load, which rapidly causes a decrease in the absolute value of the current supplied to the load by the output stage of the linear amplifier. As a result, there is less heat dissipation from the linear amplifier compared to an electronic circuit found in current practice.

Another advantage of the electronic circuit resides in the fact that the inductor of the switched-mode amplification unit is not found in the current feedback loop produced by the unit. This means that the switched-mode amplification unit controller can be adapted to operate at high bandwidth, given that the inductor is no longer located inside the loop. Additionally, the current feedback loops for the linear amplifier unit and for the switched-mode amplification unit are separated to obtain improved bandwidth in the switched-mode amplification unit.

Each linear amplifier unit and switched-mode amplification unit controller may be arranged as a PI controller rather than a hysteresis controller, which is generally not desirable. Such a PI controller placed in series with a PWM modulator is not dependent on the value of the current setpoint and, consequently, the switching frequency does not vary with a change in the value of the setpoint. This also results in the advantage of making it easier to choose inductor L.

According to an example embodiment of the present invention, an electronic circuit includes: a linear amplifier unit; and a switched-mode amplification unit adapted to assist the linear amplifier unit. An input of the linear amplifier unit and an input of the switched-mode amplification unit are connected so as to receive, at the same time, a current setpoint during operation of the electronic circuit in order to generate, via feedback, a fixed current across a load connected to an output of each of the linear amplifier unit and the switched-mode amplification unit.

The switched-mode amplification unit may include two switches mounted in series for connection between two terminals of a supply voltage source, and an inductor arranged between a connecting node of the two switches and the load at the output of the unit, the switches being adapted for activation alternately in a switched phase once the current setpoint is supplied to each unit during operation of the electronic circuit, in order to connect the inductor either to a high potential or to a low potential of the supply voltage source.

In an operating mode of the electronic circuit, a current setpoint may be supplied to each unit at the same time, and the linear amplifier unit and the switched-mode amplification unit may respectively be configured to supply a first current at the output of the linear amplifier unit and a second current at the output of the switched-mode amplification unit to generate the fixed current across the load. A mean of the first output current may be close to 0 A in a stabilized phase, and a mean of the second output current may be close to the current setpoint.

The linear amplifier unit may include a first current feedback loop with a first current sensor arranged in series with the load connected to the output of the linear amplifier unit and the switched-mode amplification unit, and the first current sensor may be adapted to supply a first measured current for comparison with the current setpoint in order to adjust a first output current in the first feedback loop.

The linear amplifier unit may include a first subtractor element arranged in the first current feedback loop, adapted to subtract the first measured current of the current setpoint, and adapted to supply a result of the subtraction to a first controller adapted to supply a control voltage to a linear amplifier having an output stage, connected between two terminals of a supply voltage source, adapted to supply the first output current.

The first controller may include at least one of (a) an analog proportional-integral controller and (b) a digital proportional-integral controller.

The switched-mode amplification unit may include a second current feedback loop with a second current sensor arranged between the connecting node of the switches and the inductor, and the second current sensor may be adapted to supply a second measured current for comparison with the current setpoint in order to adjust the second output current in the second feedback loop.

The switched-mode amplification unit may include a second subtractor element in the second current feedback loop, adapted to subtract the second measured current from the current setpoint, and to supply a result of the subtraction to a second controller to alternately control activation of the switches in a switching phase of a fixed switching period.

An output of the second controller may be connected to a pulse-width modulator connected to the two switches.

A first switch of the two switches may be arranged as a first n-type MOSFET power transistor having a gate connected to the pulse-width modulator and a drain connected to a high-potential terminal of a supply voltage source, and a second switch of the two switches may be arranged as a second n-type MOSFET power transistor having a gate connected to the pulse-width modulator and a source connected to a low-potential terminal of the supply voltage source. A connecting node of a source of the first power transistor and a drain of the second power transistor may be connected by the second current sensor to the inductor.

The second controller may be connected in series with a configurable digital pulse-width modulator to adjust the switching period of the switches.

Further features and aspects of example embodiments of the present invention are described in more detail below with reference to the appended Figures.

DETAILED DESCRIPTION

In the following description, all the parts of the electronic circuit, which are known to the skilled practitioner in this technical field, have been simplified. Such an electronic circuit can be used primarily for controlling a nanometric positioning electric motor, for example, for the semiconductor market. It may be arranged as a linear motor, in which positioning feedback is controlled by this electronic circuit, which controls the motor. An electronic circuit of this kind can also be used in electrical devices for other technical fields.

Figure 3:
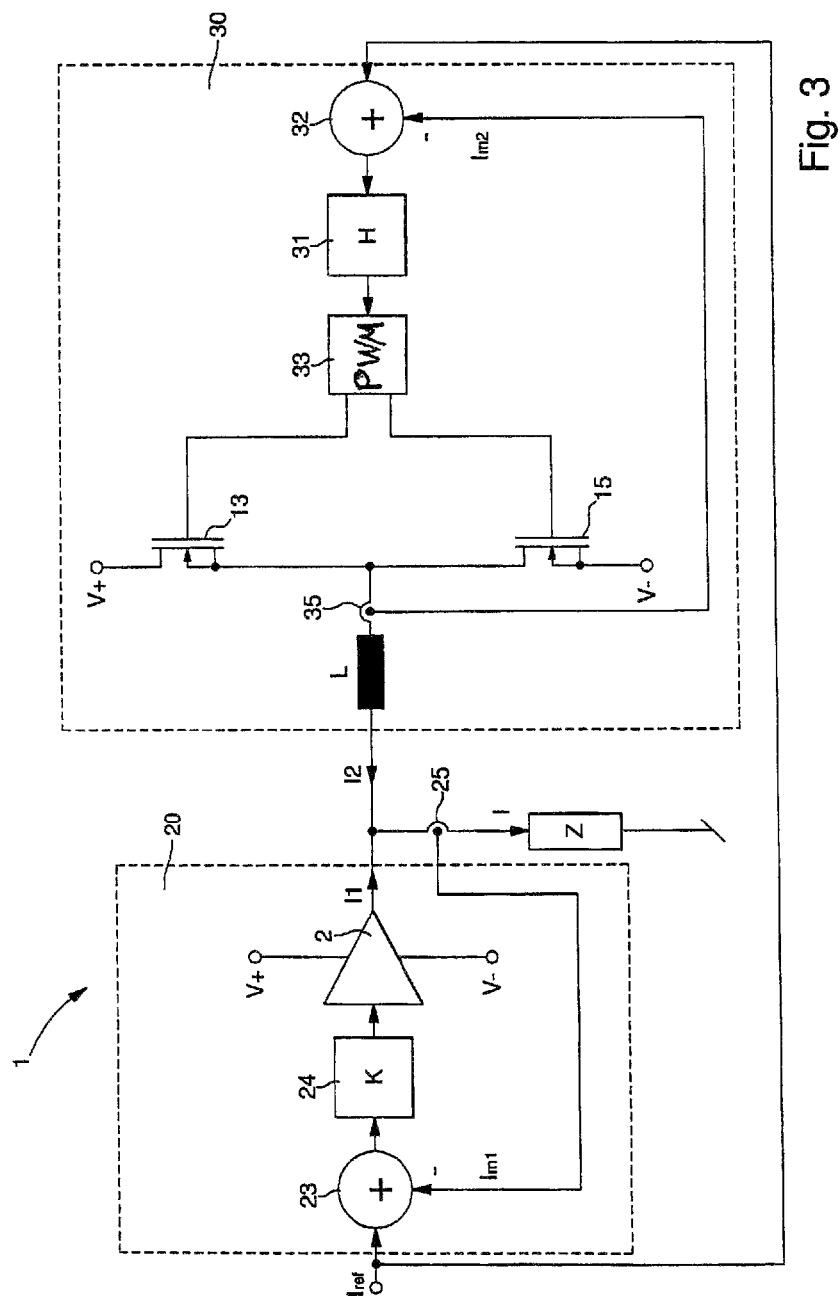
FIG. 3 schematically illustrates an electronic circuit with a linear amplifier assisted by a switched-mode amplification unit according to an example embodiment of the present invention.

FIG. 3 illustrates an electronic circuit 1, which can be used, for example, for controlling an electric motor, such as a linear motor capable of ensuring nanometric positioning. Electronic circuit 1 includes a linear amplifier unit 20 and a switched-mode amplification unit 30 to assist linear amplifier unit 20. During operation of electronic circuit 1, a reference current $I_{ref}$, which is a current setpoint, is supplied at the same time to linear amplifier 20 and switched-mode amplification unit 30. With this current setpoint, load Z, which is connected to the output of the units and which can be the electric motor that will be controlled, is crossed by a suitable fixed current I. A current feedback is thus brought about in the two units to maintain a fixed current I across load Z depending on the value of the applied current feedback $I_{ref}$. Reference current $I_{ref}$ may be constant but it can also change over time to modify the value of current I across load Z or be applied to electronic circuit 1 during specified periods of time. To control a motor, it is typical to use a sinusoidal setpoint, $I_{ref}$, synchronized to the position of the motor.

Linear amplifier unit 20 includes a first current feedback loop. Notably, linear amplifier unit 20 includes a first subtractor element 23 of the first current feedback loop. In this subtractor element 23, current $I_{m1}$, which is measured across load Z by a first sensor 25 in series with the load, is subtracted from reference current $I_{ref}$, which is the current setpoint. The result of the subtraction is supplied to a first controller 24, which is may be, for example, a conventional proportional-integral controller. This controller 24 supplies a control voltage to a linear amplifier 2, which outputs a first current I1 that will cross load Z. The value of this current I1 is modified by linear amplifier unit 20 based on the detected level of the voltage at the load and, primarily, on the value of current I across the load.

Figure 1A:
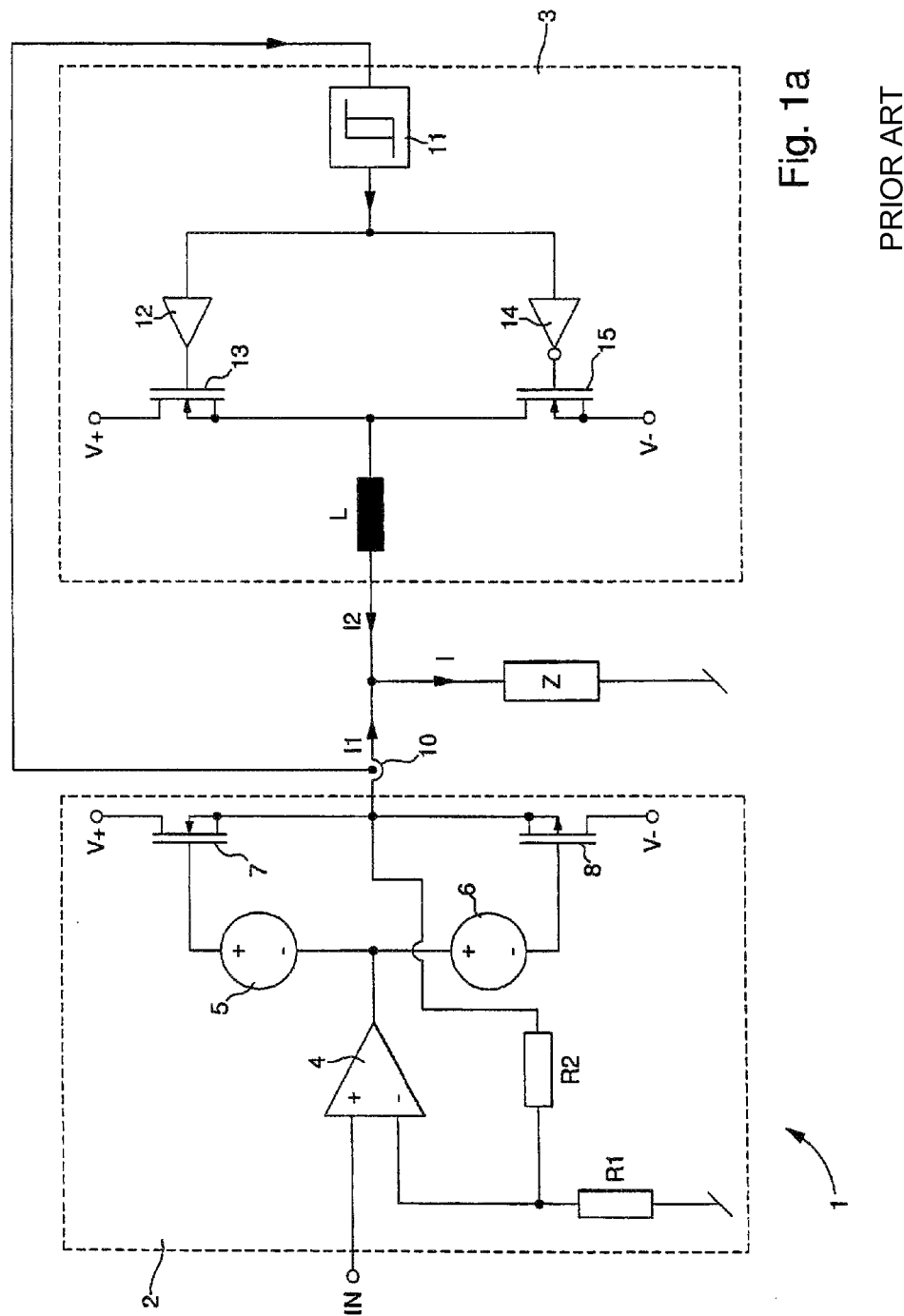
FIG. 1a shows a conventional electronic circuit with a linear amplifier assisted by a switched-mode amplification unit.

The structure of linear amplifier 2 of linear amplifier unit 20 may be identical to that presented with reference to FIG. 1a. However, the non-inverted input of this linear amplifier is controlled by the control voltage supplied by PI controller 24. This control voltage changes based on the result of the subtraction of currents in first subtractor element 23, which is supplied to the controller 24. This linear amplifier 2 is connected to a low-voltage terminal V− and to a high-voltage terminal V+ from a DC supply voltage that is not shown. The low voltage from this voltage source may, for example, be −24 V, whereas the high voltage from this voltage source may, for example, be 24 V. Consequently, it is necessary to minimize the first current I1 supplied by linear amplifier 2 to reduce the thermal dissipation of the electronic circuit, as explained above. The mean of current I1 must, in principal, be close to 0 A once the electronic circuit has been stabilized by switched-mode amplification unit 30, which assists linear amplifier unit 20.

Switched-mode amplification unit 30 includes a second current feedback loop independent of the first current feedback loop of linear amplifier unit 20. Switched-mode amplification unit 30 primarily includes a second subtractor element 32 of the second current feedback loop. In this second subtractor element 32, the current $I_{m2}$, which is measured by a second sensor 35 arranged in series ahead of an output inductor L, is subtracted from reference current $I_{ref}$, which is the current setpoint. The result of the subtraction is supplied to a second controller 31, which is preferably also a conventional PI controller. This second controller 31 supplies a control voltage to PWM modulator 33, which is connected to the gate of first n-type MOSFET power transistor 13 and to second n-type MOSFET power transistor 15. The drain of first n-type MOSFET power transistor 13 is connected to the high-voltage terminal V+ of the supply voltage source, while the source of the second n-type MOSFET power transistor 15 is connected to the low-voltage terminal V− of the supply voltage source. The source of first transistor 13 and the drain of second transistor 15 are connected to inductor L by second current sensor 35. The other end of this inductor L is connected to load Z in order to supply current I2.

It should be noted that first and second transistors 13 and 15 constitute first and second switches. These first and second switches can also be provided with other types of transistors, such as p-type MOSFET transistors or NPN and/or PNP bipolar power transistors, even IGBTs. Additionally, each current sensor 25 and 35 can be a shunt-type (resistor) sensor or a magnetic flux sensor (Hall probe). However, other types of sensor can be provided for measurement of the current in each current feedback loop.

PWM modulator 33 is used to produce conduction, alternately and cyclically, either in first power transistor 13 or in second power transistor 15. Conduction switching of power transistors 13 and 15 is dependent on the output signal of PI controller 31, which depends on the result of the subtraction of currents in second subtractor element 32. Conduction switching of the power transistors inversely modifies the increase or decrease of current I2 supplied by the switched-mode amplification unit across inductor L and load Z. Advantageously, this inductor L is not in the second current feedback loop. This provides better switching bandwidth in the switched-mode amplification unit compared to the conventional arrangements mentioned above. Second controller 31 can thus be adjusted for a high bandwidth regardless of the value of inductor L.

Through the use of PI controllers 24 and 31, and PWM modulator 33, the switching period of power transistors 13 and 15 is not dependent on the current setpoint $I_{ref}$ applied to linear amplifier unit 20 and switched-mode amplification unit 30. On the other hand, the switching period can be modified in PWM modulator 33. This also allows for the reduction of voltage or current ripple at load Z.

PI controller 24 may be of the analog type, which can be used, for example, in linear amplifier unit 20 in order to obtain a bandwidth in the first current feedback loop on the order of 1 MHz. However, such bandwidth is theoretically obtainable for small currents, which means that the constituent components whereof must be adjusted. A digital PI controller 24 may preferably be used. In such a case, the bandwidth in the first feedback loop can be between 10 and 50 kHz, making it easier to configure the controller with parameters stored in a register provided for that purpose. With a digital controller 31 of this type in the second current feedback loop, the bandwidth can be at least 1 kHz. Use of a switching frequency of 20 kHz can then be provided. The switching parameters of power transistors 13 and 15 can then also be easily programmed in a register of second controller 31.

If hysteresis controllers are used instead of PI controllers, the switching period is dependent on the value of the current setpoint and on the instantaneous voltage applied to load Z. This is due to the variation in the slope of current I2 as it increases or decreases between two switching thresholds. These hysteresis controllers, which are also referred to as on/off, react only when the error has exceeded a certain threshold. Under these conditions, it is preferable to use PI controllers for electronic circuit 1. They also allow the current difference used for switching the power transistors to be reduced. A very small residual voltage or current ripple is found at the load during each switching operation for, on the one hand, the current setpoint $I_{ref}$ is applied directly to the two units and, on the other hand, the current feedback loops are independent of one another. Inductor L is also not provided in each feedback loop.

The signal-to-noise ratio (SNR) of electronic circuit 1 of example embodiments of the present invention is very good and can even be on the order of 100 dB or greater. In general, this represents an increase of more than 20 dB above conventional electronic circuits. Such an electronic circuit can, therefore, be used, for example, to control a nanometric positioning electric motor while ensuring low heat dissipation.

Figure 2A:
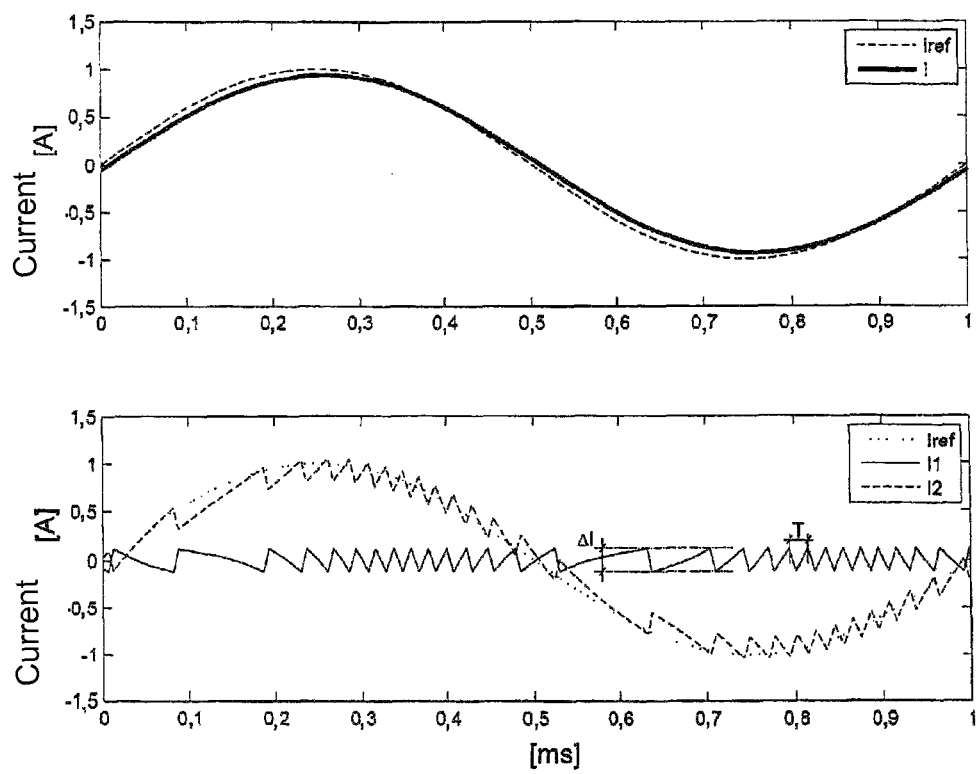
FIG. 2a shows a graph of the current variation at the output of the linear amplifier unit and switched-mode amplification unit of the electronic circuit shown in FIG. 1b.
Figure 2B:
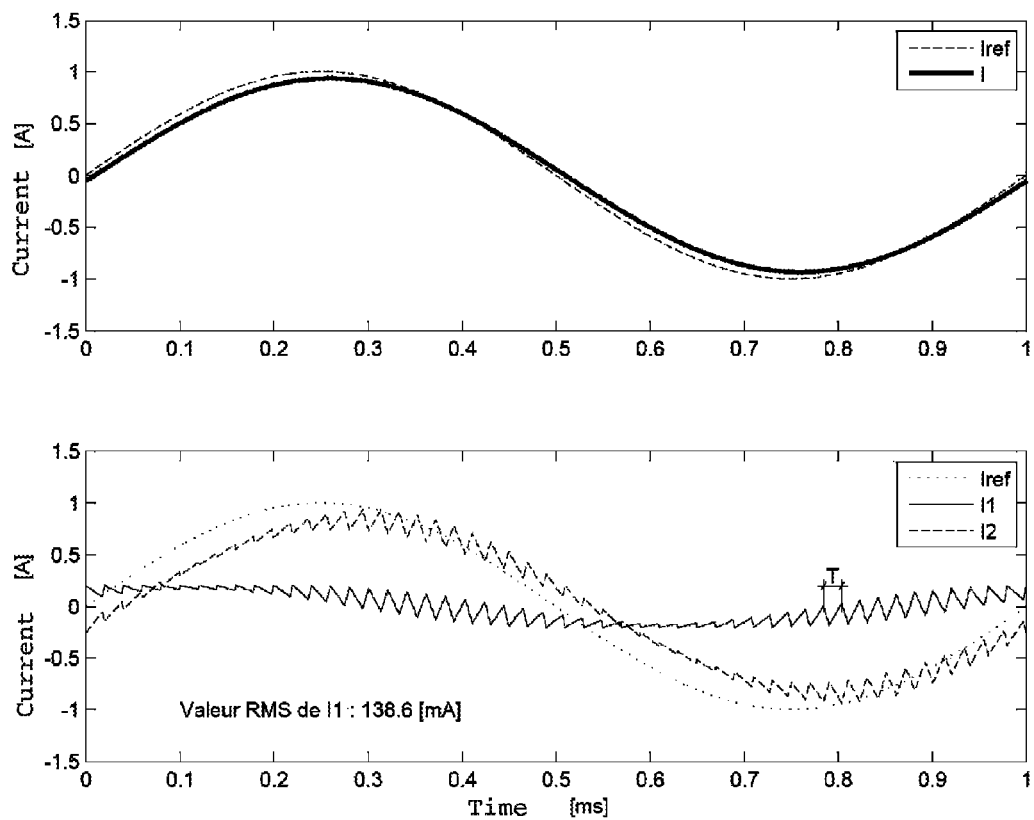
FIG. 2b shows a graph of the current variation at the output of the linear amplifier unit and switched-mode amplification unit of the electronic circuit shown in FIG. 1c.
Figure 4:
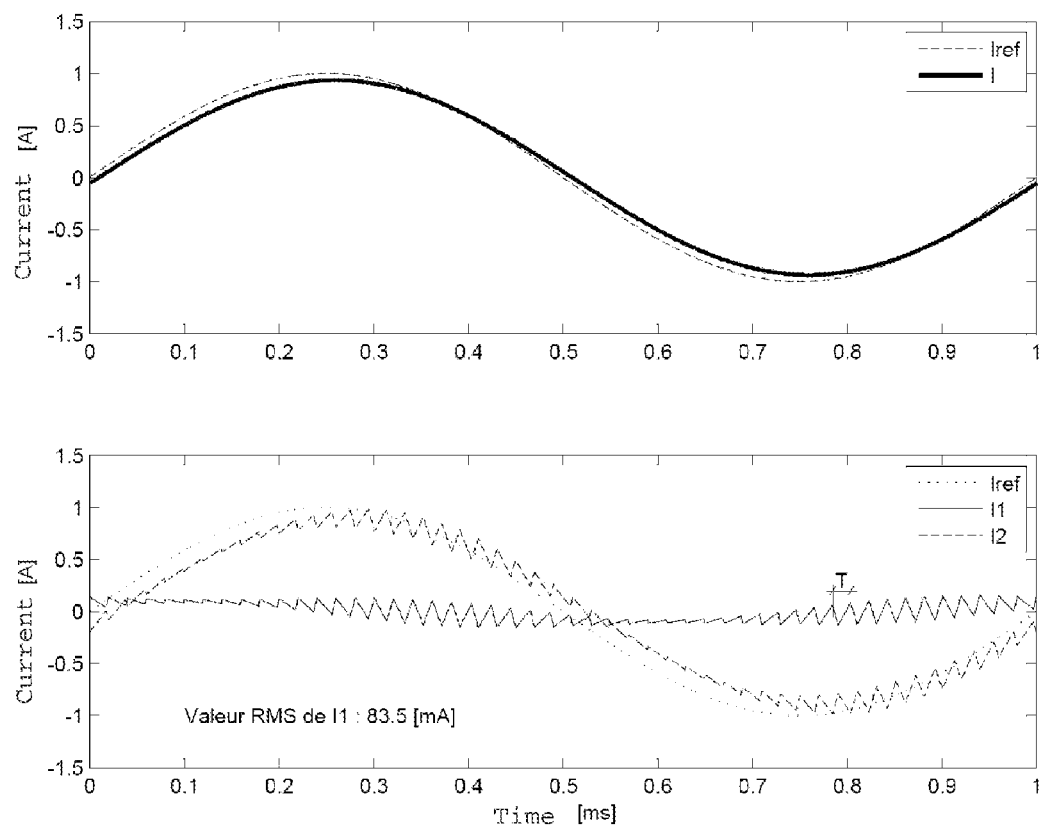
FIG. 4 is a graph comparing the variation of the output currents of the linear amplifier unit and the switched-mode amplification unit of an electronic circuit according to an example embodiment of the present invention as a function of a supplied current setpoint.

FIG. 4 is a simplified graphic of the variation of output currents from the linear amplifier unit and switched-mode amplification unit of the electronic circuit according to an example embodiment of the present invention. The graph at the top of FIG. 4 is identical to that in FIG. 2a since current feedback in the linear amplifier unit has not been modified. In the graph at the bottom, however, it can be seen that the residual ripple of current I1 has been brought to the root-mean-square (RMS) value of 83.5 mA. Thus, the electronic circuit according to example embodiments of the present invention combines the advantages of constant frequency switching while minimizing the residual ripple of current I1 by providing improved bandwidth for current feedback in the switched-mode unit.

Figure 1B:
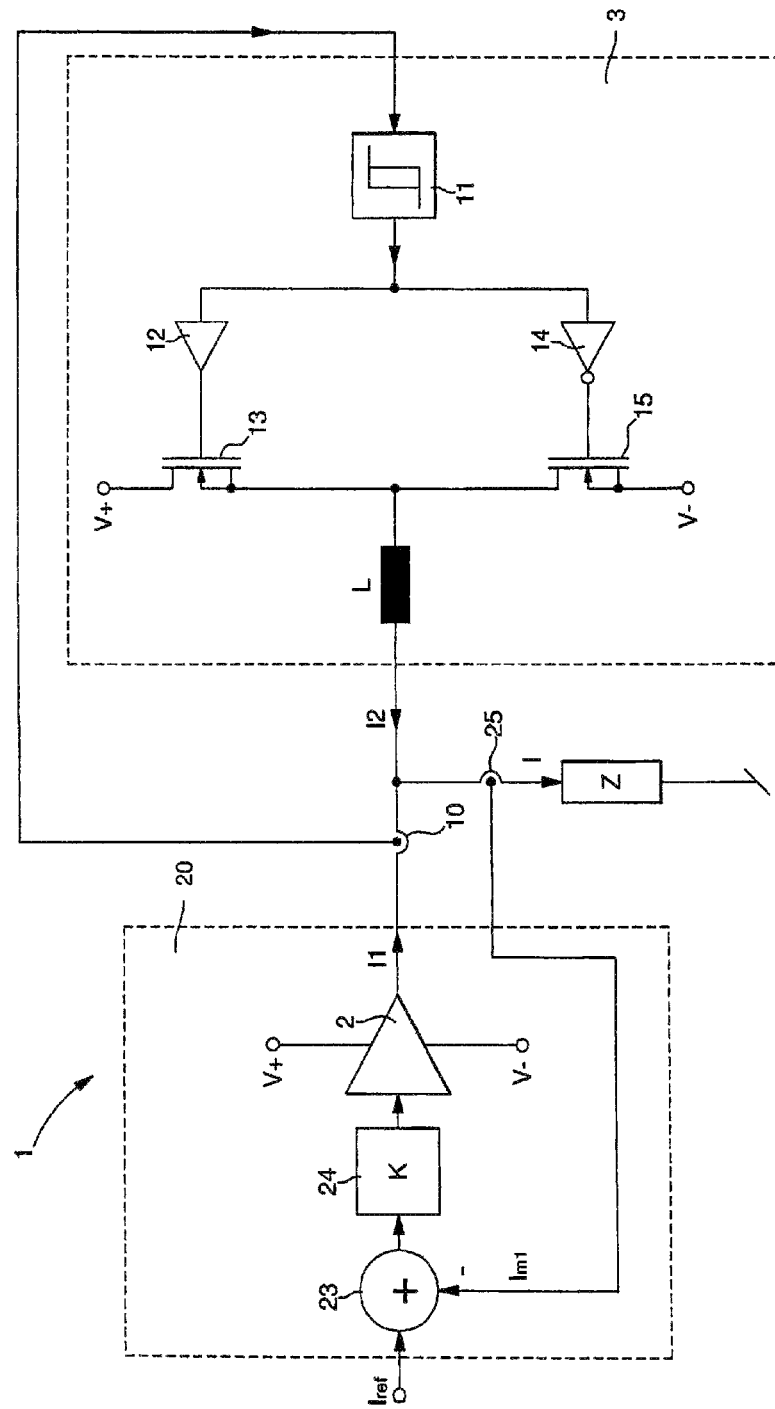
FIG. 1b shows a variant of the electronic circuit with a linear amplifier of FIG. 1a, whose current is controlled.
Figure 1C:
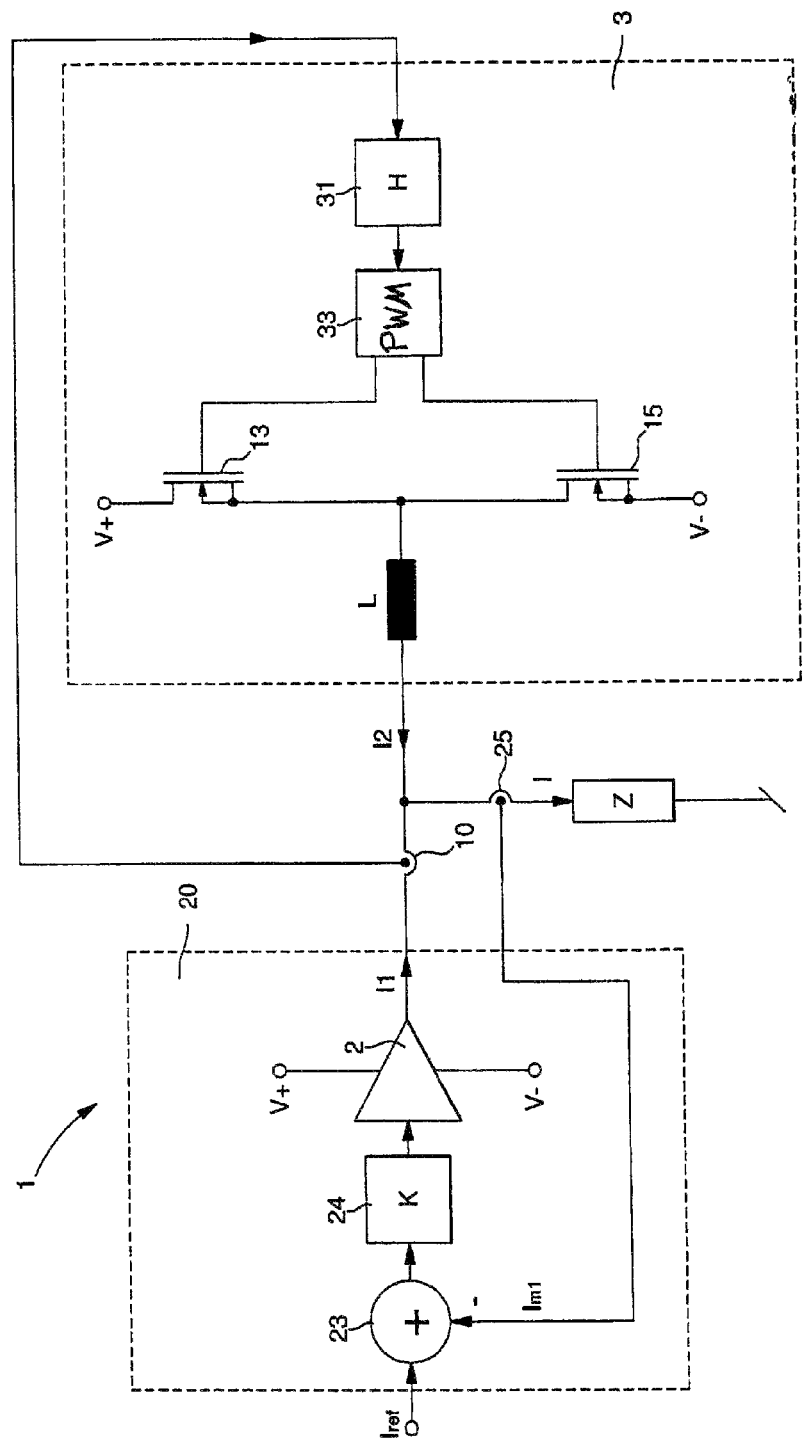
FIG. 1c shows a variant of the electronic circuit with a linear amplifier of FIG. 1b, wherein current feedback in the switched-mode amplification unit is carried out by a PI controller.

For example, if the hysteresis of a hysteresis controller of the electronic circuit shown in FIGS. 1a and 1b is adjusted to +/−100 mA, nothing will pass through as long as the measured current does not exceed 100 mA. By assuming that current I1 has a null value at the start and that the current rise is 48 V/10 mH=4800 A/s, it then takes (100 mA)/(4800 A/s) =21 μs until the first switching operation of the hysteresis controller. This defines a pure delay. Additionally, the rise of current I1 is influenced by the bandwidth of the first feedback loop of the linear amplifier unit. If the first loop has a bandwidth of 20 kHz, approximately 50 μs are lost waiting for current I1 to be controlled. Current feedback in the second loop of the switched-mode amplification unit, by measurement of current I1, typically has a 50 to 100 μs delay compared to the systems of example embodiments of the present invention.

The electronic circuit of example embodiments the present invention can be used to very rapidly activate the switched-mode amplification unit by simultaneously applying the same current setpoint $I_{ref}$ to the two units of the circuit. This can be used to avoid the delay mentioned above in relation to an electronic circuit of current practice. Because there is no threshold current, the two units are always active, in particular, even when the current setpoint is low, for example, less than 100 mA. The switched-mode amplification unit can also be momentarily deactivated if, for example, the method associated with the electronic application has an electron gun or electronic microscope. Any switching noise must then be avoided, since it is harmful to the method employed. Additionally, the switched-mode unit includes all the elements of a standard switched-mode amplifier on the market. A switched amplifier can then be added to an existing linear amplifier. To further improve the performance obtained, it is also possible to add precontrols to the two voltage setpoints at the output of controllers 24 and 31. These precontrols can, in particular, be based on an estimate of the voltage induced in the load as a function of motor speed.

To rapidly rotate a motor, the current setpoint changes to approximately 1 kHz. A few watts of dissipated power are then saved in the electronic circuit of example embodiments of the present invention compared to conventional arrangements.

What is claimed is:
1. An electronic circuit, comprising:
a linear amplifier unit; and
a switched-mode amplification unit adapted to assist the linear amplifier unit;
wherein an input of the linear amplifier unit and an input of the switched-mode amplification unit are connected so as to receive, at the same time, a current setpoint during operation of the electronic circuit in order to generate, via feedback, a fixed current across a load connected to an output of each of the linear amplifier unit and the switched-mode amplification unit.

2. The electronic circuit according to claim 1, wherein the switched-mode amplification unit includes two switches mounted in series for connection between two terminals of a supply voltage source, and an inductor arranged between a connecting node of the two switches and the load at the output of the switched-mode amplification unit, the switches being adapted for activation alternately in a switched phase once the current setpoint is supplied to each unit during operation of the electronic circuit, in order to connect the inductor either to a high potential or to a low potential of the supply voltage source.

3. The electronic circuit according to claim 1, wherein, in an operating mode of the electronic circuit, the current setpoint is supplied to each unit at the same time, the linear amplifier unit and the switched-mode amplification unit being respectively configured to supply a first current at the output of the linear amplifier unit and a second current at the output of the switched-mode amplification unit to generate the fixed current across the load, a mean of the first output current being close to 0 A in a stabilized phase, a mean of the second output current being close to the current setpoint.

4. The electronic circuit according to claim 1, wherein the linear amplifier unit includes a current feedback loop with a current sensor arranged in series with the load connected to the output of the linear amplifier unit and the switched-mode amplification unit, wherein the current sensor is adapted to supply a measured current for comparison with the current setpoint in order to adjust an output current in the current feedback loop.

5. The electronic circuit according to claim 4, wherein the linear amplifier unit includes a subtractor element arranged in the current feedback loop, adapted to subtract the measured current of the current setpoint, and adapted to supply a result of the subtraction to a controller adapted to supply a control voltage to a linear amplifier having an output stage, connected between two terminals of a supply voltage source, adapted to supply the output current.

6. The electronic circuit according to claim 5, wherein the controller includes at least one of (a) an analog proportional-integral controller and (b) a digital proportional-integral controller.

7. The electronic circuit according to claim 2, wherein the switched-mode amplification unit includes a current feedback loop with a current sensor arranged between the connecting node of the switches and the inductor, the current sensor adapted to supply a measured current for comparison with the current setpoint in order to adjust an output current in the current feedback loop.

8. The electronic circuit according to claim 7, wherein the switched-mode amplification unit includes a subtractor element in the current feedback loop, adapted to subtract the measured current from the current setpoint, and to supply a result of the subtraction to a controller to alternately control activation of the switches in a switching phase of a fixed switching period.

9. The electronic circuit according to claim 8, wherein an output of the controller is connected to a pulse-width modulator connected to the two switches.

10. The electronic circuit according to claim 9, wherein a first switch of the two switches is arranged as a first n-type MOSFET power transistor having a gate connected to the pulse-width modulator and a drain connected to a high-potential terminal of a supply voltage source, a second switch of the two switches is arranged as a second n-type MOSFET power transistor having a gate connected to the pulse-width modulator and a source connected to a low-potential terminal of the supply voltage source, a connecting node of a source of the first power transistor and a drain of the second power transistor being connected by the current sensor to the inductor.

11. The electronic circuit according to claim 8, wherein the controller is connected in series with a configurable digital pulse-width modulator to adjust the switching period of the switches.

* * * * *